June 15, 1965 H. KARSH 3,189,891
ANALOG-TO-DIGITAL CONVERTERS
Filed Nov. 6, 1961
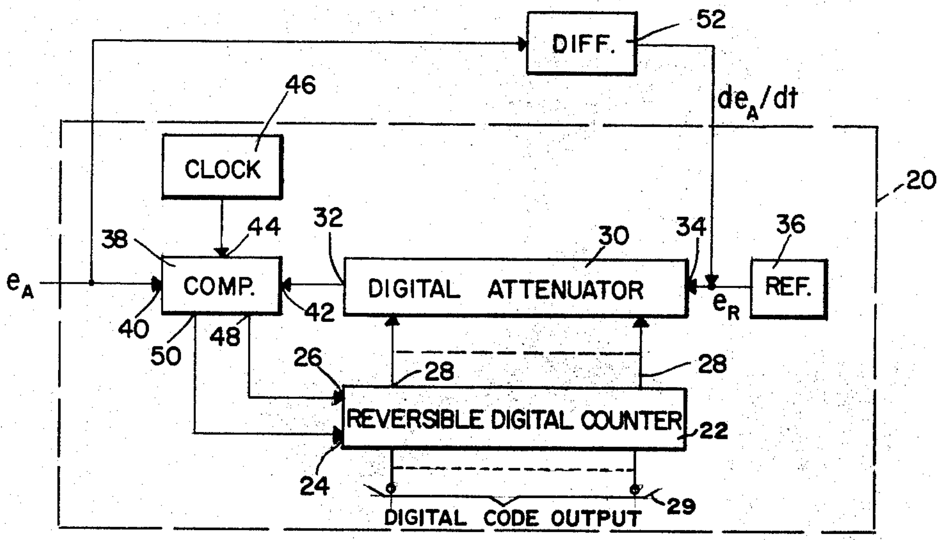
INVENTOR.
HERBERT KARSH
BY Robert J. Schiller
ATTORNEY United States Patent Office 3,189,891
Patented June 15, 1965

3,189,891

ANALOG-TO-DIGITAL CONVERTERS

Herbert Karsh, Lexington, Mass., assignor to Epsco, Incorporated, Cambridge, Mass., a corporation of Massachusetts Filed Nov. 6, 1961, Ser. No. 150,568
3 Claims. (Cl. 340—347)

This invention relates to reference voltage sources and more particularly to an apparatus for controlling the voltage of a reference source in certain analog-to-digital conversion equipment.

With the advent of the high speed digital computer there arose the development of analog-to-digital converters which essentially translate continuously varying analog signals into computer compatible digital format, usually through a sampling technique. In many converters, samples are taken of the magnitude of the analog signal and each sample is compared to a fixed reference voltage as by a series of successive approximations based on a sequence of successively switched weighted impedances. If the input signal should vary during the time required for the conversion, the digital code derived can erroneously denote the input. In order to limit the error in conversion, the prior art has provided sample-and-hold devices which are intended to maintain each input signal sample at a steady level during the conversion period. Because such sample-and-hold devices are quite expensive, the prior art has also sought to limit the error by reducing the sampling aperture or by increasing the conversion speed or both.

Analog-to-digital converters of high speed (e.g., those capable of performing conversions at a rate of 5,000 samples per second or greater) operating on an input signal whose dynamics are considerably slower than the conversion rate, for instance by a factor of 10, are capable of yielding digital outputs of acceptable accuracy without employing a sample-and-hold, thus reducing by a considerable amount the cost and complexity of the equipment. Nevertheless, if the analog input signal is changing during the conversion time, there will be an error in the resulting digital code. For instance, if the magnitude of the signal is increasing during the conversion time, and the analog-to-digital (A-D) converter is of the appropriate type, the most significant digit, which is the first to be determined, will be set by the initial value of the signal; the resulting increase of the signal during the conversion time may thereafter be ignored by the converter. On the other hand, if the input signal is decreasing during the conversion time, the resulting digital code may be erroneously larger than the average signal value.

The present invention therefore contemplates the provision of an improvement in reference voltage-controlled A-D converters whereby corrections are made for conversion errors due to changing dynamics of the input signal. More particularly, a principal object of the present invention is to provide an improvement in high speed A-D converters employing reference voltage sources for comparison purposes, which converters are employed to digitize a relatively slowly changing analog input signal, the improvement comprising means for controlling the reference voltage responsively to the time rate of change of the input signal. Another object of the present invention is to provide in such a converter input signal responsive means for improving the accuracy of the conversion according to the derivative of the input signal obtained during each conversion period.

Other objects of the invention will in part be obvious and will in part appear hereinafter.

The invention accordingly comprises the apparatus possessing the construction, combination of elements and arrangement of parts which are exemplified in the following detailed disclosure, and the scope of the application of which will be indicated in the claims.

For a fuller understanding of the nature and objects of the invention, reference should be had to the following detailed description taken in connection with the accompanying single figure of the drawing in which is shown a block diagram of an exemplary analog-to-digital conversion circuit embodying the principle of the present invention.

Generally, in an A-D converter of the type heretofore described, the conversion time is so short relative to the rate of change of the input signal that the slope of the latter may be considered relatively constant. Where the slope is positive, the digital representation of the signal increment will err by being smaller than the average value of the increment and where the slope is negative the error is usually such that the digital representation is greater than the average analog signal value. Where the slope is zero as at maxima and minima, the accuracy of the conversion is optimum. The present invention therefore contemplates employing a correcting voltage applied to the converter. It is understood that the present invention will improve conversion accuracy for conversions made on signals whose slope does not change sign during the conversion period. When the derivative of the signal is positive, the correction voltage is subtracted from the reference voltage; and when negative, added to the reference voltage.

Referring now to the drawing, there is shown an exemplary embodiment of the invention which includes a typical analog-to-digital converter of known type generally indicated by the reference numbered 20. In the form shown of converter 20 there is included counter 22, the latter being a forward-backward counter of the binary type such as is fully described in FIG. 4 of U.S. Patent No. 2,989,741 issued June 20, 1961, to B. M. Gordon et al. The complete disclosure of the foregoing patent to Gordon et al. is incorporated herein by reference as that patent relates to apparatus having pertinence to the invention here described. Counter 20 is characterized in having a forward input terminal 24 and a backward input terminal 26 and includes a plurality of flip-flop stages (not shown) for storing the value of a weighted digital number bit. The stages are arranged consecutively in the order of relative significance of the respective bits. A signal in the form of a pulse applied to the forward input causes the counter to increase the count stored therein, while a pulse applied to the backward input correspondingly decreases the count. The counter has a plurality, indicated in part by a broken line, of output terminals 28, one for each flip-flop stage. The binary count in the counter is obtained from output terminals 29 in the form of the presence or absence of output voltages from the flip-flops.

Converter 20 also includes a digital-to-analog conversion means in the form of digital attenuator 30 which may be substantially the same circuit disclosed in U.S. Patent No. 2,976,527, issued March 21, 1961, to B. K. Smith. An attenuator of this type is characterized in having a plurality of impedances (not shown) selectively coupled between a common output terminal 32 and an input line 34 from a reference voltage source 36. The latter is usually a highly accurate fixed voltage source, usually of the Zener reference type. The value of each impedance in attenuator 30 is weighted in accordance with the significance of a related bit of a digital number usually of the binary variety. Each impedance is selectively coupled to the line from reference source 36 according to the particular digit of associated significance, the coupling being accomplished, for instance by switching means respectively associated with each impedance. The operation of each switching means, in turn, is controlled by the voltages obtained from the appropriate ones of output terminals 28 of counter 22. It will thus be seen that the operation of digital attenuator 30 is controlled by the output of the counter such that the attenuator output at terminal 32 constitutes an analog signal determined by the digital attenuation of the reference voltage, $e_R$, from source 36 according to the digital value or count present in counter 22.

The attenuator is coupled with means for comparing the digitally attenuated output of attenuator 30 against the analog input signal $e_A$ in order to determine the relative magnitude of the input analog signal and the output signal of the attenuator. This means is in the form of comparator 38, well known in the art, having first, second and third input terminals, 40, 42 and 44 respectively. The analog input signal is applied to terminal 40, and terminal 42 is connected by appropriate conductive means to terminal 32 of the attenuator for receiving the output from the latter. In order that the comparator output be placed in pulse train form, the comparator is preferably controlled by a timing pulse source, such as clock 46. Clock 46, for instance, may be an oscillator of the free running multivibrator type or the like which is connected to the terminal 44 of the comparator for delivering thereto a timing pulse train of appropriate frequency. The pulse train times the appearance of appropriate pulses from comparator outputs 48 and 50 to the forward or backward input terminals of the counter.

The converter thus described constitutes a closed analog-to digital conversion loop which in operation results in the output of comparator 38, as controlled by clock 46, being directed either to the forward or backward input terminal of counter 22 in order to respectively increase or decrease the counts in the counter. When initially an analog signal is applied to terminal 40 of the comparator and there is substantially no count in the counter, there will be no signal applied to terminal 42 of the comparator. Hence, the output of the comparator will consist of a series of a train of output pulses from terminal 50 to forward terminal 24 of the counter at a frequency set by the clock frequency. As the count in the counter therefore increases rapidly, each flip-flop in the counter applies an appropriate voltage to its corresponding output terminal 28, and these voltages in turn are applied to the control terminals of the switching means in digital attenuator 30. This causes an analog output to appear at output terminal 32 and the input terminal 42 of the comparator. When the two signals applied to inputs 42 and 40 of the counter are substantially equal in magnitude within the least significant bit stored in the counter, the count in the counter becomes static and the loop is in equilibrium. A decrease in the value of $e_A$ will correspondingly cause pulses to be applied by the comparator to backward input terminal 26 of the counter, reducing the count in the latter and forcing the loop to re-establish its equilibrium accordingly. It will be seen that at equilibrium, the count in the counter then represents the digital value of the input analog signal $e_A$.

As previously noted, the count established by the digital-to-analog conversion loop during the conversion time (i.e. for the disclosed converter, the time required for the loop to reach equilibrium from a prior equilibrium state) can be erroneous if the input analog signal changes during the conversion period. Hence, the present invention contemplates the employment of means for adjusting the effective reference voltage to compensate for the change in the input analog signal during the conversion period. By the term effective reference voltage, it is intended to mean the voltage actually applied to the reference terminal of the converter such as that applied to attenuator 30 along input line 34. In the preferred embodiment, the means for compensating for variations in the input analog signal comprises a device such as differentiator circuit 52. The latter may take the form of a simple differentiator circuit such as is described in Vacuum Tube Circuits and Transistors, Arquianban and Addler, Wiley, 1956, pp. 210–212, a differentiating amplifier, or the like, well known in the art. Differentiator 52 is connected to input terminal 40 of the comparator so that the input analog signal is also applied simultaneously to the differentiator as well as to the comparator. The output of the differentiator is connected to line 34.

In operation, an analog input signal $e_A$ is applied to comparator 38 and therefore to differentiator 52. The output of the differentiator, is of course, the derivative of the input signal and is applied to line 34 to modify the effective reference voltage. In one example of the operation of the device it can be assumed that the variation of the input analog signal is such that its slope is positive and the sign of the slope does not change during the conversion period. The output of the differentiator will then constitute a relatively constant positive value which when applied to line 34 will modify the negative reference voltage by reducing the latter. For a given instantaneous count produced in the counter by the comparator output, the attenuated signal provided by attenuator 30 is then somewhat lesser in magnitude than it would be were there no correcting signal applied to the attenuator input to modify the magnitude of the reference voltage from reference source 36. Hence, the digital value present when the counter reaches equilibrium will be somewhat greater than the value that would have occurred had the reference voltage remained unmodified. It should be noted that the reference voltage in converters of this type are greater than the maximum expected magnitude of the input signal. An effective reduction in the reference voltage applied to the digital attenuator will increase the counter count, and an increase in the effective reference voltage, as would be the case where the input signal has a negative slope, will result in a corresponding decrease in the counter count. It is believed that the effect of applying the derivative of the input signal to modify the reference voltage is a non-linear effect and hence does not necessarily result in a complete correction; however, the effect does result in an increase in the accuracy of the digital determination of the value of the average or means magnitude of the voltage of the input signal present during the conversion period.

This invention is equally applicable to many other analog-to-digital converters employing reference signals against which the analog signal is compared, particularly so-called successive approximation type converters, for instance, that shown in U.S. Patent 2,569,927, issued October 2, 1951, to Gloess et al., and others employing similar concepts.

Since certain changes may be made in the above apparatus without departing from the scope of the invention herein involved, it is intended that all matter contained in the above description or shown in the accompanying drawing shall be interpreted as illustrative and not in a limiting sense.

What is claimed is:

1. In information translating apparatus for converting an input signal into digital form, the apparatus being of the type having:

a reversible counter;

a converter connected to the counter for continuously converting the digital count of the counter to an analog signal;

a comparator for comparing the input signal with the analog signal;

and clock means for causing the comparator to intermittently compare the input signal and the analog signal and provide an output causing the counter to alter its count in the direction equalizing the comparator signals;

the improvement comprising:

means for differentiating the input signal;

and means for applying the differentiated signal to the converter to modify the analog signal applied to the comparator.

2. In information translating apparatus for converting an input signal into digital form, the apparatus being of the type having:

a reversible counter;

a converter connected to the counter for continuously converting the digital count of the counter to an analog signal;

a comparator for comparing the input signal with the analog signal;

and clock means for causing the comparator to intermittently compare the input signal and the analog signal and provide an ouput causing the counter to alter its count in the direction equalizing the compared signals;

the improvement wherein the converter comprises a digital attenuator and a source of a reference signal, the digital attenuator attenuating the reference signal in accordance with the count in the reversible counter to provide the analog signal;

and means for differentiating the input signal, the differentiated derivative of the input signal being applied to modify the reference signal.

3. In information translating apparatus for converting an input signal into digital form, the apparatus being of the type having:

a reversible counter;

a converter connected to the counter for continuously converting the digital count of the counter to an analog signal;

a comparator for comparing the input signal with the analog signal;

and clock means for causing the comparator to intermittently compare the input signal and the analog signal and provide an ouput causing the counter to alter its count in the direction equalizing the compared signals;

the improvement wherein the converter employs a source of a fixed reference voltage coupled to a digital attenuator, the attenuator causing the reference voltage to be attenuated in accordance with the count in the reversible counter to provide the analog signal;

and means for differentiating the input signal and combining the differentiated signal with the reference voltage to modify the value of the reference voltage applied to the digital attenuator.

References Cited by the Examiner

UNITED STATES PATENTS

| | | | |
|---|---|---|---|
| 2,845,597 | 7/58 | Perkins | 340—347 |
| 2,897,486 | 7/59 | Alexander et al. | 340—347 |

OTHER REFERENCES

Pages 625 to 628 and 631 to 634, 1957, Engineering Electronics, Ryder, J. D.

MALCOLM A. MORRISON, *Primary Examiner.*